US012500111B2

(12) United States Patent
Edara et al.

(10) Patent No.: US 12,500,111 B2
(45) Date of Patent: Dec. 16, 2025

(54) HEAT-ASSISTED DIE EJECTION SYSTEM

(71) Applicant: Intel Corporation, Santa Clara, CA (US)

(72) Inventors: Chetan Harsha Edara, Chandler, AZ (US); Kyle Pfeiffer, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 563 days.

(21) Appl. No.: 17/709,482

(22) Filed: Mar. 31, 2022

(65) Prior Publication Data

US 2023/0317500 A1  Oct. 5, 2023

(51) Int. Cl.
*H01L 21/683* (2006.01)

(52) U.S. Cl.
CPC ............ *H01L 21/6836* (2013.01); *H01L 2221/68327* (2013.01); *H01L 2221/68381* (2013.01)

(58) Field of Classification Search
CPC ........... H01L 21/6836; H01L 21/67103; H01L 21/67132; H01L 2221/68327; H01L 2221/68381; H01L 2221/68318
See application file for complete search history.

(56) References Cited

U.S. PATENT DOCUMENTS

| 4,921,564 | A | * | 5/1990 | Moore | H01L 21/68 156/701 |
|---|---|---|---|---|---|
| 6,582,223 | B2 | * | 6/2003 | Yasumura | H01L 21/6838 438/459 |
| 6,889,427 | B2 | * | 5/2005 | Yee | H01L 21/67092 228/6.2 |
| 9,196,520 | B1 | * | 11/2015 | Sanchez | H01L 21/67132 |
| 2008/0006922 | A1 | * | 1/2008 | Gutentag | H01L 21/6835 257/E21.516 |
| 2009/0055124 | A1 | * | 2/2009 | Herchen | G01B 5/061 33/503 |
| 2015/0114572 | A1 | * | 4/2015 | Sanchez | H01L 21/6836 156/707 |
| 2020/0024883 | A1 | * | 1/2020 | Scheuring | F16H 25/20 |
| 2022/0319818 | A1 | * | 10/2022 | Chen | H01L 21/3065 |
| 2022/0336254 | A1 | * | 10/2022 | Man | H01L 21/67092 |
| 2023/0253220 | A1 | * | 8/2023 | Jang | H01L 21/67103 118/300 |

FOREIGN PATENT DOCUMENTS

KR  102127695 B1 * 6/2020 ......... H01L 21/6839

\* cited by examiner

*Primary Examiner* — Shaun M Campbell
(74) *Attorney, Agent, or Firm* — Viering, Jentschura & Partner mbB (57) ABSTRACT

The present disclosure is directed to die ejection system including a heated element configured to heat an adhesive layer on a bottom side of the adhesive layer, wherein a die is placed on the top side of the adhesive layer, and the die is removed from the adhesive layer by heat-assisted means. A conventional needle-based die ejector system may also be converted into the present die ejection system using a retrofit process.

17 Claims, 5 Drawing Sheets

HEAT-ASSISTED DIE EJECTION SYSTEM

BACKGROUND

A wafer goes through three changes until it becomes a semiconductor chip. The process for the first change is slicing a lump-formed ingot to make a wafer, and the process for the second change is engraving a transistor on the front of the wafer. Finally, in the packaging process, the wafer is supported on an adhesive layer and divided into individual semiconductor chips, making it a complete semiconductor chip. In the packaging process, dicing is performed to divide the wafer into multiple dies supported on an adhesive layer. Such individualization of a wafer to multiple dies is called "singulation". A subsequent process of separating the dies from the adhesive layer they are supported on is called "die ejection". Due to the recent increase in the degree of integration of semiconductors, the thickness of wafers is becoming thinner, making the die ejection process from the adhesive layer increasingly difficult. Among the major defects that may be attributed to the die ejection process is an increased risk of die crack initiation and propagation. The above described defect is a major yield loss factor that may need to be addressed.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

In the semiconductor packaging industry, wafers are typically supported on an adhesive layer (e.g., dicing tape) for a wafer dicing process ("singulation"). After dicing the wafers into individual dies, the dies thus obtained require to be ejected (i.e., removed) from the adhesive layer. Conventionally, this die ejection process may be carried out by using a needle-based die ejector system to eject the individual dies from the adhesive layer. The working mechanism of such conventional needle-based die ejector system involves stretching the adhesive layer under reduced pressure to induce a peeling effect on an interface between the adhesive layer and the die. However, recently, the die thickness decreases, causing the peeling energy release rate to decrease. Moreover, a non-uniform stress distribution and peeling effect is caused by the needle pattern that is applied to the thinner die. Altogether, using the conventional needle-based die ejector system with progressively thinner dies makes it more difficult to eject the dies from the adhesive layer using the needle-based die ejector system, so that there may be an increased risk of die crack initiation and propagation, which, in turn, may result in a decreased yield.

Figure 1A:
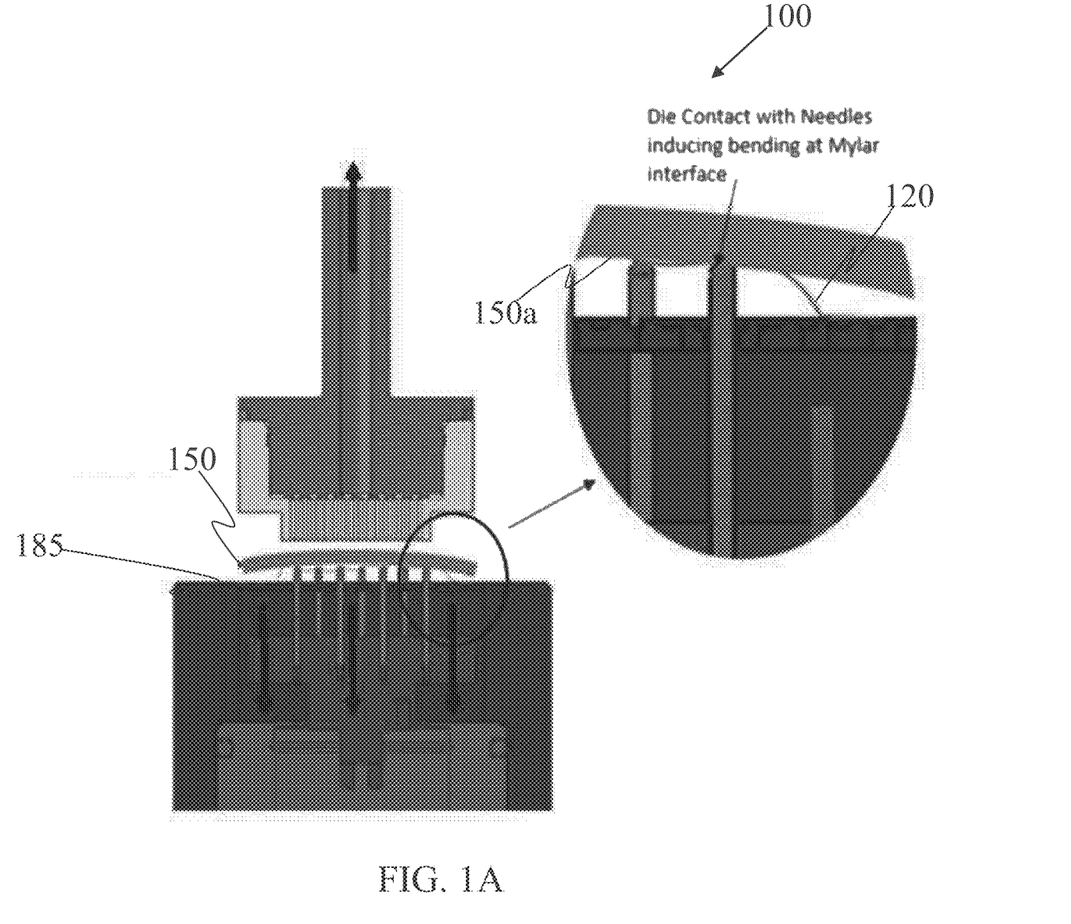
FIG. 1A schematically shows a needle-based die ejection system in a side view.

For example, as shown in FIG. 1A, in the conventional needle-based die ejector system 100, a needle-based ejection mechanism 185 including single needle and multiple needle configurations is used to eject a die 150 by puncturing through the adhesive layer 120 (e.g., mylar). The needles in the conventional needle-based die ejector system 100 have a diameter of about 0.7 millimeters (mm) with different tip radii ranging from substantially zero to 50 micrometers (μm) to stretch the adhesive layer 120 under reduced pressure in order to create a peeling effect at the interface between the adhesive layer 120 and the die 150. The peeling effect is supposed to facilitate the ejection of the die 150 from the adhesive layer 120. Hence, the conventional technology relies on bending the die 150 during the process to eject the die 150 from the adhesive layer 120.

Figure 1B:
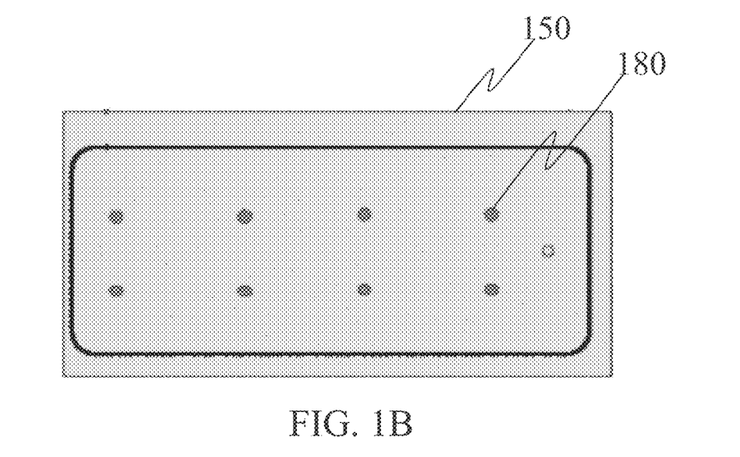
FIG. 1B schematically shows a die in an overlay with a needle pattern in a top view.

As shown in FIG. 1B, an overlay of the needle pattern 180 as viewed from the top illustrates that the needles are positioned in such a way that the needles create a bending effect to eject the die 150. The stress induced during the needle-based die ejection system 100 is highly dependent on the needle pattern 180 and is shown to induce cracking during a needle-based die ejection process. The risk of die cracking is higher, when the aspect ratios of the dies increase, in particular for dies with a thickness of less than 150 μm. In brief, depending on the position where the needles meet a bottom surface 150a of the die 150, the stress induced during the needle-based die ejection process may be non-uniform, leading to increased risk of crack initiation and propagation. Moreover, there may be a risk of needle tip punctures through the adhesive layer (e.g., mylar) damaging the bottom surface 150a of the die 150. Thus, the ability to eject (e.g., pick-up) the die 150 is highly dependent on the needle configuration overlap with a surface of the die and requires extensive process optimization.

Figure 2:
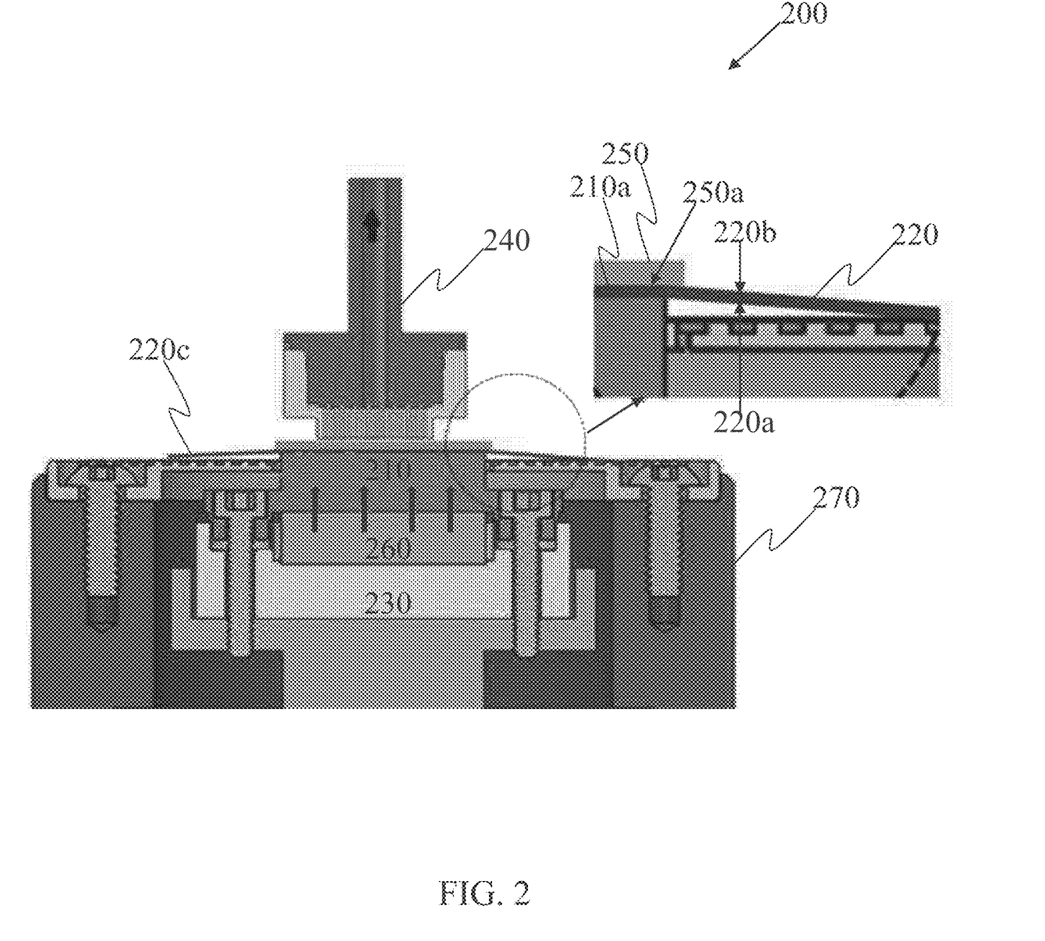
FIG. 2 schematically shows a die ejection system in a side view according to the invention.

The proposed solution presented herein, as shown in FIG. 2, describes a die ejection system 200 that is heat assisted, thereby eliminating the use of needles for die ejection. The die ejection system 200 takes advantage of the change in the adhesion strength of the adhesive layer 220 (e.g., mylar) and elastic properties with increase in temperature. Under the application of temperatures greater than 150° C., the adhesion strength of the interface between the die 250 and the adhesive layer 220 decreases, making it easier for the die pick-up device 240 to pick-up the die 250 from the adhesive layer 220.

Accordingly, in a first aspect, there is provided a die ejection system 200 including a heated element 210 configured to heat an adhesive layer 220 on a bottom side 220a of the adhesive layer 220. The die ejection system 200 further includes a support structure 230 supporting the heated element 210 thereon. The die ejection system 200 further includes a die pick-up device 240 configured to remove a die 250 attached to a top side 220a of the adhesive layer 220 after the adhesive layer 220 is heated by the heated element 210. The advantages in using this die ejection system 200 include a lower risk of crack initiation and propagation due to a uniform stress distribution and peeling effect.

Moreover, die ejection using the present die ejection system 200 may be carried out in a faster time. For example, using the conventional needle-based die ejector system, the ejection of a die from the adhesive layer may take about 200 to 300 milliseconds (ms). In contrast, the ejection of a die 250 from the adhesive layer 220 in the present die ejection system 200 may take about 15 to 20 ms. Furthermore, using the present die ejection system 200 allows for the ejection of a die 250 that is as thin or thinner than 80 µm without damaging the die 250. Customization of the heated element 210 may further allow for the present die ejection system 200 to carry out multiple die ejections at the same instance.

According to various aspects, the heated element 210 may include a material with a high thermal conductivity, such as a metal. For example, the material of the heated element 210 may have a thermal conductivity (measured in Watts per meter Kelvin (W/mK)) that may exceed 100 W/mK, optionally 200 W/mK, optionally 300 W/mK and optionally 400 W/mK. According to various aspects, the material of the heated element 210 may be selected from the group consisting of copper, gold, aluminum, germanium, silver, and alloys thereof. Advantageously, the material of the heated element 210 may withstand temperatures of the order of 300° C. for at least 4 hours (h). In one example, the material of the heated element 210 may include copper.

According to various aspects, the heated element 210 may be elevated to reduce a distance (not shown) between the heated element 210 and the adhesive layer 220. Vice versa, in some aspects, the heated element 210 may be lowered to increase the distance between the heated element 210 and the adhesive layer 220. Advantageously, the distance between the heated element 210 and the adhesive layer 220 may be adjusted depending on process stage. For example, the distance between the heated element 210 and the adhesive layer 220 may be about 50 µm to about 150 µm at the time of die ejection, optionally at about 100 µm. Before or after ejection, the distance between the heated element 210 and the adhesive layer 220 may about 2 mm, or greater than 2 mm.

According to various aspects, the heated element 210 may include a polygon structure. The structure of the heated element 210 may depend on the shape of the die 250. The heated element 210 may have the function of ejecting the die 250, or rendering the interface between the die 250 and the adhesive layer 220 to be sufficiently non-adhesive such that the die 250 may be removed or picked up from the adhesive layer 220.

According to various aspects, the heated element 210 may have a surface 210a. The surface 210a may be a square or a rectangle. In some aspects, the sides of the surface 210a that define an area of the surface 210a may each individually have a length that is about 1.5 mm to about 2.5 mm, optionally 1.7 mm to about 2.1 mm. Preferably, the surface 210a may have an area that is designed to be slightly smaller than an area of a bottom surface of the die 250a. Advantageously, in aspects where the surface 210a has an area that is designed to be slightly smaller than the area of the bottom surface of the die 250a, neighboring dies of the die 250 are not heated at the same time as the die 250. In one example, the surface 210a may have an area wherein both sides defining the area have a length of 1.9 mm. Correspondingly, both sides of an area defining the bottom surface of the die 250a may have a length that is slightly bigger than 1.9 mm, e.g., both sides of an area defining the bottom surface of the die 250a may have a length of 2.0 mm.

According to various aspects, the adhesive layer 220 may include a heat-sensitive material. In particular, the adhesive layer 220 may include a material that has a decreased adhesion strength upon the application of heat. In some aspects, the heat-sensitive material may include a polyester. In one example, the adhesive layer 220 may include mylar.

According to various aspects, the die ejection system 200 may further include a support structure 230. The support structure 230 may be configured to support the heated element 210 placed thereon. The support structure 230 may be attached to a wafer mounter 270. The wafer mounter 270 may include a table that may be configured to secure a periphery of the adhesive layer 220c thereon.

According to various aspects, the support structure 230 may further include a heater 260. The heater 260 may be configured to provide heat to the heated element 210. Accordingly, the heater 260 may be configured to heat the heated element 210 to a temperature in the range of about of about 200° C. to about 300° C., optionally to a temperature of above 300° C.

According to various aspects, the heater 260 may include a material with a high thermal conductivity, such as a ceramic. For example, the material of the heater 260 may have a thermal conductivity (measured in Watts per meter Kelvin (W/mK)) that may exceed 100 W/mK, optionally 200 W/mK, optionally 300 W/mK and optionally 400 W/mK. According to various aspects, the material of the heater 260 may be selected from the group consisting of an oxide, a nitride, a carbide, and a boride, such as a polycrystalline diamond ceramic, aluminum nitride, beryllium oxide, silicon nitride, and silicon carbide. Advantageously, an insulating material (not shown) may be provided between the heater 260 and the heated element 210, which may help to regulate the heat that is provided to the heated element 210.

According to various aspects, the die ejection system 200 may further include a die pick-up device 240. The die pick-up device 240 may be arranged on top of the die 250 and may be configured to pick up the die 250 after the adhesion strength of the die 250 to the adhesive layer 220 decreased due to the increased temperature of the adhesive layer 220. The die pick-up device 240 may be further configured to place the die 250 thus separated to an ongoing process step, such as placing it on a tape. The die pick-up device 240 may include a collet.

According to some aspects, the die pick-up device 240 may include a suction, i.e. a method to reduce pressure. This suction may be applied to the die 250 to be ejected from the adhesive layer 220. Advantageously, the suction may provide an air circulation to the die ejection system 200, which may help to dissipate excess heat from the die ejection system 200, and may allow the heat from the heater element 210 to be provided specifically to the adhesive layer 220.

Figure 3:
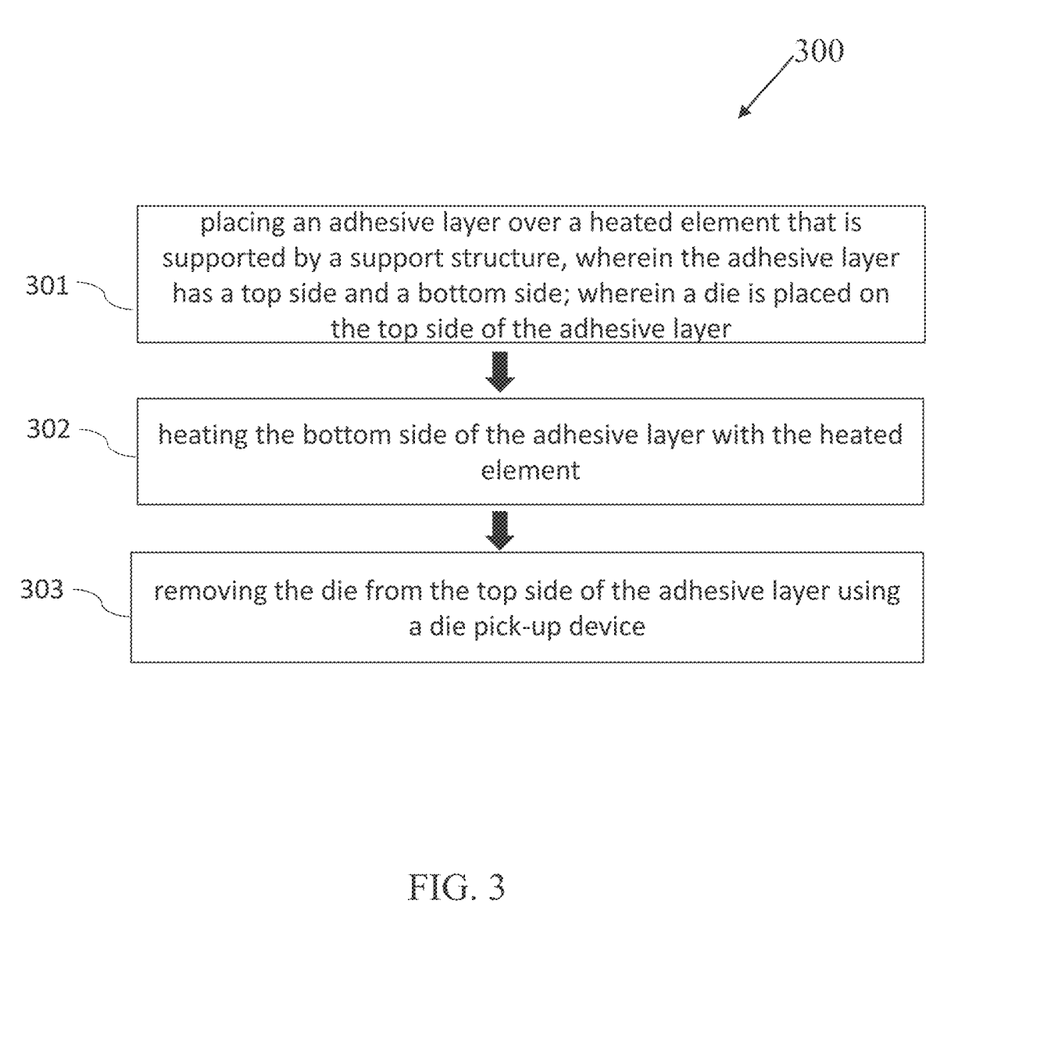
FIG. 3 shows a simplified flow diagram for an exemplary process according to an aspect of the present die ejection method.

As shown in FIG. 3, in another aspect, there is provided a die ejection method 300 including placing an adhesive layer over a heated element that is supported by a support structure. The adhesive layer may have a top side and a bottom side. A die may be placed on the top side of the adhesive layer. The die ejection method may further include heating the bottom side of the adhesive layer with the heated element. The die ejection method may further include removing the die from the top side of the adhesive layer using a die pick-up device.

By "heating" is meant that the temperature of the adhesive layer is deliberately raised such that the adhesion strength of the adhesive layer is reduced. Heating may thus involve to raise the temperature above room temperature. "Room temperature", as used herein, refers to a temperature greater than 4° C., preferably being in the range from 15° C. to 40° C., or in the range from 15° C. to 30° C., or in the range from 15° C. to 24° C., or in the range from 16° C. to 21° C. Such temperatures may include, 14° C., 15° C., 16° C., 17° C., 18°

C., 19° C., 20° C., and 21° C., each of these values including ±0.5° C. Accordingly, the heated element may be configured to heat an adhesive layer to a temperature in the range of about 100° C. to about 300° C., optionally in the range of about 150° C. to about 300° C., optionally in the range of about 150° C. to about 200° C., optionally in the range of about 100° C. to about 150° C. Advantageously, a temperature range of about 150° C. to about 300° C. may be particularly preferred. On one hand, below a temperature of about 150° C., the adhesion strength of the interface between the die and the adhesive layer may be too strong for ejection of the die. On the other hand, above a temperature of about 300° C., the temperature may be too high and the adhesive layer may melt.

Heating the adhesive layer may include the adhesive layer to be heated for less than one minute, or less than a second, or for about a time period selected from 1 ms to 200 ms, or for about a time period selected from 10 ms to about 15 ms. Advantageously, the present die ejection method may allow for a very short heating time.

FIG. 3 shows a simplified flow diagram for an exemplary method according to an aspect of the present die ejection method 300.

The operation 301 may be directed to placing an adhesive layer over a heated element that is supported by a support structure, wherein the adhesive layer has a top side and a bottom side, wherein a die is placed on the top side of the adhesive layer.

The operation 302 may be directed to heating the bottom side of the adhesive layer with the heated element.

The operation 303 may be directed to removing the die from the top side of the adhesive layer using a die pick-up device.

Figure 4A:
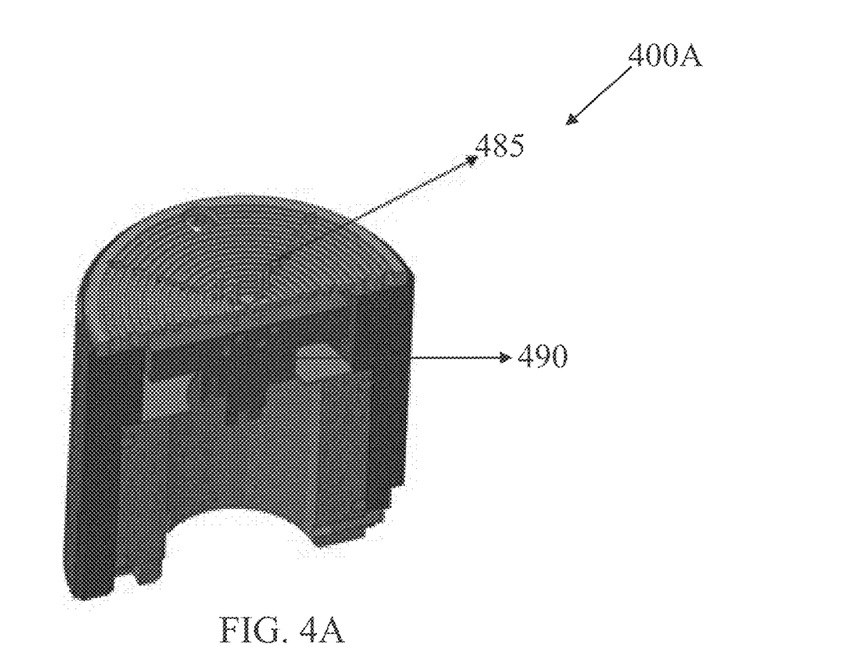
FIG. 4A and FIG. 4B schematically show a needle-based die ejection system in a perspective view and a die ejection system after undergoing a retrofit process according to the invention.
Figure 4B:
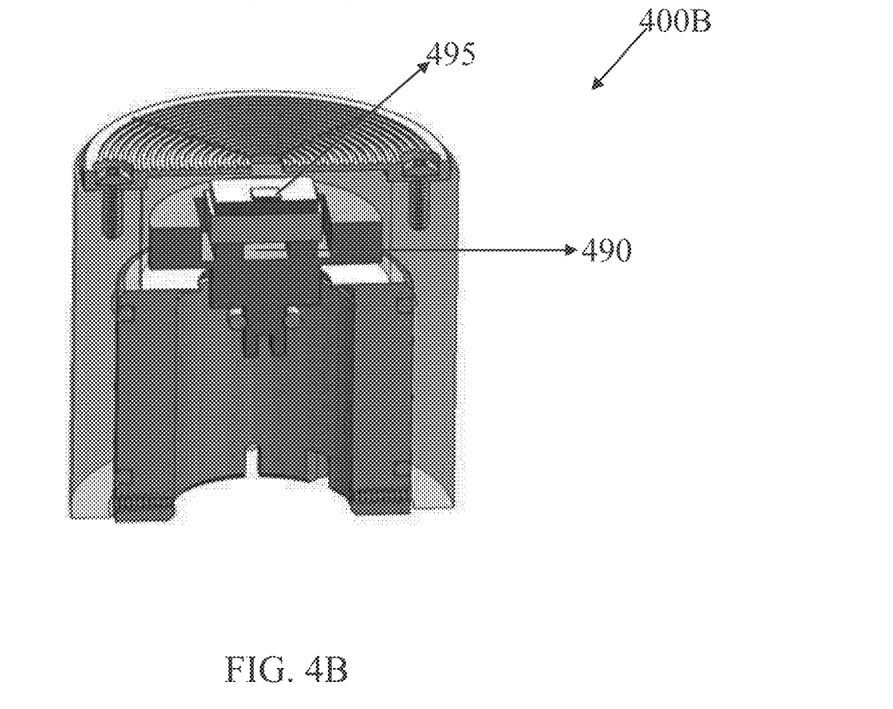

Furthermore, as shown in FIG. 4A and FIG. 4B, a needle-based die ejector system 400A may be converted easily into the present die ejection system 400B using a retrofit process without any major equipment modifications. For example, in a needle-based die ejector system 400A, a needle-based ejection mechanism 485 may be removed from a support base 490 and replaced with a heating assembly 495 to a die ejection system 400B.

Figure 5:
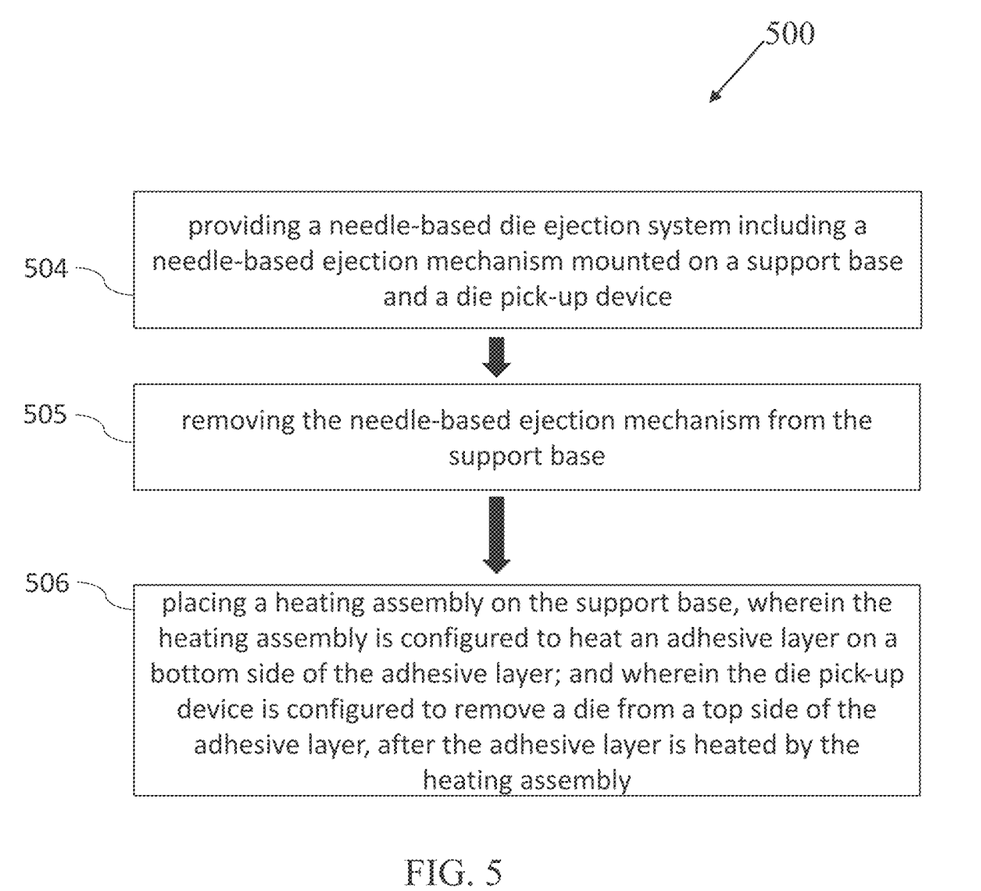
FIG. 5 shows a simplified flow diagram for an exemplary process according to an aspect of the retrofit process.

Accordingly, in another aspect, there is provided a retrofit process 500 including providing a needle-based die ejection system including a needle-based ejection mechanism mounted on a support base and a die pick-up device. The retrofit process 500 may further include removing the needle-based ejection mechanism from the support base. The retrofit process 500 may further include placing a heating assembly on the support base, wherein the heating assembly is configured to heat an adhesive layer on a bottom side of the adhesive layer; and wherein the die pick-up device is configured to remove a die from a top side of the adhesive layer, after the adhesive layer is heated by the heating assembly.

FIG. 5 shows a simplified flow diagram for an exemplary method according to an aspect of the present retrofit process 500.

The operation 504 may be directed to providing a needle-based die ejection system including a needle-based ejection mechanism mounted on a support base and a die pick-up device.

The operation 505 may be directed to removing the needle-based ejection mechanism from the support base.

The operation 506 may be directed to placing a heating assembly on the support base, wherein the heating assembly is configured to heat an adhesive layer on a bottom side of the adhesive layer; and wherein the die pick-up device is configured to remove a die from a top side of the adhesive layer, after the adhesive layer is heated by the heating assembly.

In a first example, there is provided a die ejection system including:
  a heated element configured to heat an adhesive layer on a bottom side of the adhesive layer;
  a support structure supporting the heated element thereon; and
  a die pick-up device configured to remove a die attached to a top side of the adhesive layer after the adhesive layer is heated by the heated element.

In a second example, the heated element of example 1 may be configured to be heated to a temperature of about 150° C. to about 300° C.

In a third example, the heated element of example 1 or example 2 may include a metal.

In a fourth example, the heated element of any one of examples 1 to 3 may include copper.

In a fifth example, the heated element of any one of examples 1 to 4 may have a surface for placing the adhesive layer thereon, and the surface may be smaller than the bottom side of the adhesive layer.

In a sixth example, the support structure of any one of examples 1 to 5 may include a heater.

In a seventh example, the heater of example 6 may be a ceramic heater.

In an eighth example, the heated element of example 6 or example 7 may be configured to be heated by the heater.

In a ninth example, a die ejection method may include:
  placing an adhesive layer over a heated element that is supported by a support structure, wherein the adhesive layer has a top side and a bottom side;
    wherein a die is placed on the top side of the adhesive layer;
  heating the bottom side of the adhesive layer with the heated element; and
  removing the die from the top side of the adhesive layer using a die pick-up device.

In a tenth example, the heating of example 9 may include raising the temperature of the heating element to a temperature in the range of about 150° C. to about 300° C.

In an eleventh example, the heating of example 9 or example 10 may include raising the temperature for a period of time in the range of about 1 milliseconds to 30 milliseconds.

In a twelfth example, the die pick-up device of any one of the examples 9 to 11 may remove the die from the top side of the adhesive layer by using reduced pressure method.

In a thirteenth example, the die ejection method of any one of the examples 9 to 12 may include heating the heated element with a heater element in the support structure.

In a fourteenth example, there is provided a retrofit process including:
  providing a needle-based die ejection system including a needle-based ejection mechanism mounted on a support base and a die pick-up device;
  removing the needle-based ejection mechanism from the support base; and
  placing a heating assembly on the support base, wherein the heating assembly is configured to heat an adhesive layer on a bottom side of the adhesive layer; and wherein the die pick-up device is configured to remove a die from a top side of the adhesive layer, after the adhesive layer is heated by the heating assembly.

In a fifteenth example, the heating assembly of example 14 may include a heated element and a support structure.

In a sixteenth example, the heated element of example 15 may include copper.

In a seventeenth example, the heated element of example 15 or 16 may further have a surface for placing the adhesive layer thereon, and the surface may be smaller than the bottom side of the adhesive layer.

In an eighteenth example, the retrofit process of any one of the examples 15 to 17 may include placing a heater into the support structure or the support base.

In a nineteenth example, the heated element of example 18 may be configured to be heated by the heater.

In a twentieth example, the heated element of any one of the examples 15 to 19 may include a ceramic heater.

The properties of the die ejection system and the choice of the heated element, support structure and die pick-up device presented above are intended to be exemplary for the die ejection method and the retrofit process. It will be apparent to those ordinary skilled practitioners that the foregoing process operations may be modified without departing from the spirit of the present disclosure.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

By "about" in relation to a given numerical value, such as for thickness and height, it is meant to include numerical values within 10% of the specified value.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

The invention claimed is:

1. A die ejection system comprising:
a single heated element having a single top surface, wherein an entire extent of the single top surface of the single heated element is smaller than a bottom surface of a die of a diced wafer disposed on an adhesive layer, wherein the single heated element is positioned under a bottom side of the adhesive layer disposed below the die, wherein the entire extent of the single top surface of the single heated element is configured to heat the bottom surface of the die through an air gap disposed between the entire extent of the single top surface of the single heated element and the bottom side of the adhesive layer;
a support structure comprising a heater supporting the single heated element thereon, wherein the heater directly contacts the single heated element; and
a die pick-up device configured to remove the die attached to a top side of the adhesive layer after the adhesive layer is heated by the single heated element.

2. The die ejection system of claim 1, wherein the heated element is configured to be heated to a temperature of about 150° C. to about 300° C.

3. The die ejection system of claim 1, wherein the heated element is configured to be adjustable for elevating and/or lowering.

4. The die ejection system of claim 3, wherein the heated element comprises copper.

5. The die ejection system of claim 1, wherein the heated element is structured to correspond with a shape of the die.

6. The die ejection system of claim 1, wherein the heater is a ceramic heater.

7. The die ejection system of claim 1, wherein the heated element is configured to be heated by the heater.

8. A die ejection method comprising:
placing a wafer having a plurality of dies on an adhesive layer over a plurality of heated elements that is disposed in a support structure of a die ejection system, wherein each heated element of the plurality of heated elements has a top surface, wherein the adhesive layer has a top side and a bottom side, wherein the plurality of dies are correspondingly disposed above the plurality of heated elements that are smaller than the bottom surfaces of the plurality of dies;
leaving an air gap between an entirety of the top surface of each heated element and the bottom side of the adhesive layer;
heating the bottom side of the adhesive layer under the plurality of dies with the plurality of heated elements, wherein the heating is through the air gap disposed between the entirety of the top surface of each heated element and the bottom side of the adhesive layer; and
removing the plurality of dies from the top side of the adhesive layer using a die pick-up device.

9. The die ejection method of claim 8, wherein the heating comprises raising the temperature of the heated element to a temperature in the range of about 150° C. to about 300° C.

10. The die ejection method of claim 8, wherein the heating comprises raising the temperature for a period of time in the range of about 1 millisecond to 30 milliseconds.

11. The die ejection method of claim 8, wherein the die pick-up device removes the die from the top side of the adhesive layer by using a reduced pressure method.

12. The die ejection method of claim 8, further comprising adjusting a distance between the heated elements and the adhesive layer based on a process stage.

13. A retrofit process comprising:
providing a needle-based die ejection system comprising a needle-based ejection mechanism mounted on a support base and a die pick-up device for removing a plurality of dies from a diced wafer having a bottom surface with an adhesive layer;
removing the needle-based ejection mechanism from the support base; and
placing a heating assembly on the support base, wherein the heating assembly is configured with a plurality of heated elements, wherein the support base comprises a heater supporting the plurality of heated elements thereon, wherein the heater directly contacts the plurality of heated elements;
heating, by the heater in contact with the plurality of heated elements, a bottom side of the adhesive layer under the plurality of dies through an air gap disposed between an entirety of a top surface of each heated element and the bottom side of the adhesive layer; and
removing, by the die pick-up device, one or more dies from a top side of the adhesive layer after heating the adhesive layer.

14. The retrofit process of claim 13, wherein the plurality of heated elements is configured to be adjustable for elevating and/or lowering.

15. The retrofit process of claim 13, wherein the plurality of heated elements comprises copper.

16. The retrofit process of claim 14, wherein the plurality of heated elements are structured to correspond with a shape of the plurality of dies.

17. The retrofit process of claim 13, wherein the heater comprises a ceramic heater.

\* \* \* \* \*